United States Patent [19]
Schlangenotto et al.

[11] Patent Number: 5,731,605
[45] Date of Patent: Mar. 24, 1998

[54] TURN-OFF POWER SEMICONDUCTOR COMPONENT WITH A PARTICULAR BALLAST RESISTOR STRUCTURE

[75] Inventors: Heinrich Schlangenotto, Neu-Isenburg; Josef Serafin, Muehlheim, both of Germany

[73] Assignee: Daimler-Benz Aktiengesellschaft, Stuttgart, Germany

[21] Appl. No.: 682,702

[22] PCT Filed: Jan. 30, 1995

[86] PCT No.: PCT/EP95/00307

§ 371 Date: Jul. 26, 1996

§ 102(e) Date: Jul. 26, 1996

[87] PCT Pub. No.: WO95/21461

PCT Pub. Date: Aug. 10, 1995

[30] Foreign Application Priority Data

Feb. 1, 1994 [DE] Germany ............... 44 02 884.9

[51] Int. Cl.⁶ ..................... H01L 29/74; H01L 31/111
[52] U.S. Cl. .................. 257/164; 257/165; 257/133
[58] Field of Search ..................... 257/132, 133, 257/138, 147, 152, 153, 162, 163, 164, 176

[56] References Cited

FOREIGN PATENT DOCUMENTS

| 0477594 | 4/1992 | European Pat. Off. . |
|---|---|---|
| 4102099 | 8/1991 | Germany . |
| 4310606 | 10/1993 | Germany . |

*Primary Examiner*—Wael Fahmy
*Attorney, Agent, or Firm*—Spencer & Frank

[57] ABSTRACT

A power semiconductor component which can be turned off by gate control and whose semiconductor body has a plurality of unit cells arranged side by side which are comprised of a p-emitter region (1) adjacent to the anode, an adjoining lightly doped n-base region (2), followed by a p-base region (3) and an n-emitter region (4) embedded therein and which unit cells form a thyristor structure. At least one p-region (5) is embedded in the n-emitter region (4) of the unit cells, with the p-region forming a ballast resistor and being provided with two ohmic contacts, one of which forms the outer cathode metallization (K), which has no contact with the n-emitter region (4), and the other of which is a floating contact (K') which simultaneously contacts the n-emitter region (4) ohmically.

16 Claims, 7 Drawing Sheets

TURN-OFF POWER SEMICONDUCTOR COMPONENT WITH A PARTICULAR BALLAST RESISTOR STRUCTURE

BACKGROUND OF THE INVENTION

The invention relates to a power semiconductor component which can be turned off by gate control and whose semiconductor body has a plurality of unit cells arranged side by side which are comprised of a p-emitter region adjacent to the anode, an adjoining lightly doped n-base region, followed by a p-base region and an n-emitter region embedded therein and which unit cells form a thyristor structure. Such a component is known, for example, from DE 38 02 050 A1.

In the off-state voltage range above 600 V, power semiconductor components of the above-mentioned type are characterized by a lower on-state voltage at a defined current and thus by lower on-state power dissipation and a higher permissible current density than other power semiconductor components which can be turned off such as the MOSFET, the insulated gate bipolar transistor (IGBT) and the (normal) bipolar transistor. In contrast to the latter, they are also suitable up to very high off-state voltages. In practical applications, the gate current-controlled GTO thyristors are widely used. A problem of high-power GTO thyristors is that they tend to form filaments of high current density during turn-off, whereby the current that can be turned off is significantly reduced.

A drawback of the GTO thyristors compared to power semiconductor components controlled by voltage at an MOS gate such as the MOSFET and IGBT is that they require a much higher control and wiring complexity. In order to combine the advantages of a good transmission characteristic on the one hand and of low drive power on the other, MOS-controlled thyristors or MCT's (MOS controlled thyristors) were developed. Like the other power semiconductor components that can be turned off, the MCT comprises a plurality of unit cells which are connected in parallel and disposed side by side. The thyristor of these unit cells of the MCT comprises a MOSFET integrated into the n-emitter region, which MOSFET opens a current bypass from the p-base to the n-emitter during turn-on and thus turns off the power semiconductor component.

The current filamenting, which already is a drawback in the GTO, even results in considerably greater impairment of the turn-off capacity in the MCT. This is the case because the charge carriers are only removed from the control base by way of a voltage which, including the channel voltage of the turned-on MOSFET, is equal to the forward voltage of the emitter base junction and which further decreases by heating. Thus, in MCT's having a larger surface, the current that can be turned off without the risk of destruction is very considerably reduced due to the filamenting.

The transmission characteristics of the GTO and MCT are similar to that of a conventional thyristor, i.e., different from the MOSFET, IGBT and bipolar transistor, the current does not tend toward a saturation value as the voltage increases. This means that, in the event of a short circuit of the load, the current is not limited by the component itself so that fuses must be connected upstream to prevent destruction in the event of a short circuit. In other words, the GTO and MCT are not "short-circuit-proof", which is considered a serious drawback compared to, for example, the IGBT.

In order to prevent current filamenting in these components it is known from DE 38 02 050 A1 to insert a ballast resistor into the connection between the n-emitter region of the unit cells and the outer cathode, namely in the form of a resistive film. Since, in this manner, it is problematic to set the resistor to be sufficiently accurate and homogeneous, it is known from EP 0 433 825 A1 to integrate the ballast resistor in lateral form and to select it as non-linear resistor to increase the effect, with the resistor increasing as the current increases. The resistor was embodied by an n-channel MOSFET of the depletion type. Here, the n-emitter is directly connected to the cathode contact via the more lightly doped n-channel region. But the components cited in this reference have the drawback that under the cathode metallization a parasitic thyristor is present which is easily turned on in the presence of high dU/dt loads and increased temperatures, thus losing the effect of the ballast resistor. To prevent this, the same reference teaches to short-circuit the n-region connected to the cathode with the adjacent p-base by way of the metallization. The consequence is, however, that up to a considerable distance from the short-circuit point the main thyristor is also prevented from latching. Therefore, the unit cell must have a relatively large lateral dimension so that the MOS channel width that can be reached per semiconductor surface and thus the switchable current per surface are greatly reduced here as well. The component does not yet have a current saturation up to high voltages, i.e., it is not short-circuit-proof.

It is the object of the invention to create a turn-off power semiconductor component with thyristor structure, wherein the current filamenting is prevented by an integrated ballast resistor without generating a parasitic thyristor or impairment of the transmission characteristic due to an emitter base short circuit comprised in the unit cells. Preferably, the ballast resistor should be non-linear and rise as the current rises. Furthermore, it is an object of the invention to embody such a component in such a manner that it can be turned on and off by an MOS gate and that it has a current-limiting characteristic.

SUMMARY OF THE INVENTION

The above objects are accomplished according to the invention in a power semiconductor component of the type mentioned at the outset in that at least one p-region is embedded in the n-emitter regions of the unit cells, with the p-region forming a ballast resistor and being provided with two ohmic contacts of which one forms the outer cathode metallization, which has no contact with the n-emitter region, and of which the other is a floating contact which simultaneously contacts the n-emitter region ohmically. Through the floating cathode contact flows, on the one hand, an electron current into the n-emitter region and, on the other, a hole current of identical size to the outer cathode through the p-region embedded in the n-emitter region. The p-region between the contacts forms the ballast resistor which counters current filamenting. A parasitic thyristor is prevented. Furthermore, it is advantageous that the unit cell does not comprise short circuits of the p-base with the cathode so that in the on-state the thyristor structure under the floating contact fully carries current over the whole width. Preferably, the p-region embedded in the n-emitter region laterally has a $p^+pp^+$-structure such that it is more highly-doped under the contacts than in the intermediate region which forms the ballast resistor.

In an advisable embodiment, a p-channel MOSFET of the depletion type is integrated between the p-base region and the p-region embedded in the n-emitter region, with the source and drain region of the p-channel MOSFET forming the p-base or the p-region embedded in the n-emitter region. The power semiconductor component is turned off by way of this MOSFET of the depletion type in that, on the surface of the n-emitter region, a p-channel is formed by inversion and thus a current path from the p-base to the cathode. The MOS control considerably reduces the complexity for the driver electronics.

In a further advisable embodiment of the invention, the $p^+pp^+$-structures embedded in the n-emitter region, together with an insulated gate connected with the floating cathode, form a MOSFET of the depletion type whose source region is the $p^+$-region provided with the floating contact and whose drain region is the $p^+$-region connected with the cathode. The special advantage of this embodiment is that the ballast resistor rises nonlinearly with the current, whereby its effect is amplified. Further advantageous embodiments of the invention are described in claims 6 to 9.

The invention is based on the finding that a lateral ballast resistor can be integrated easily between the n-emitter region and the cathode and be configured as MOSFET of the depletion type in an embodiment without creating a parasitic thyristor or generating an emitter-base short circuit.

In the following, the embodiments of the invention are described in greater detail by way of the drawings from which further advantages ensue.

DETAILED DESCRIPTION OF THE PREFERRED EMBODIMENTS

Figure 1:
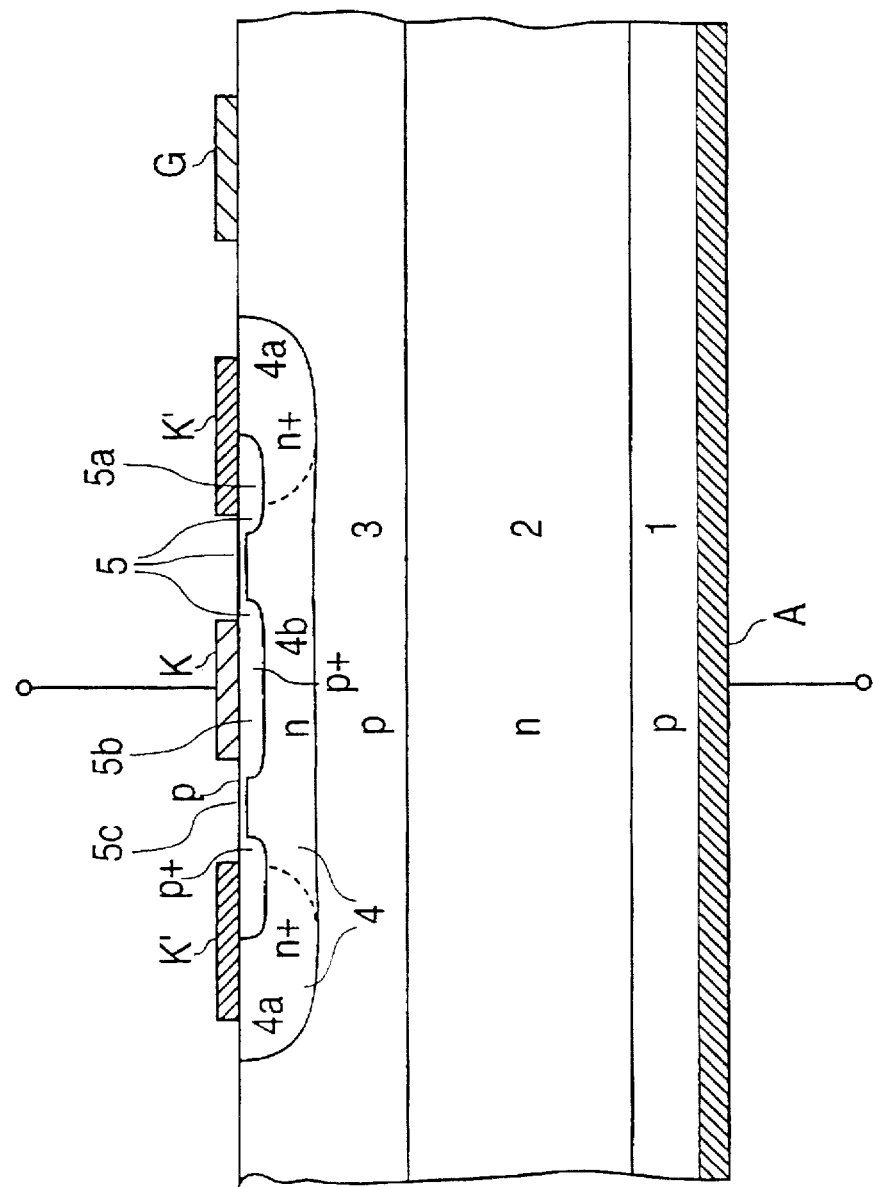
FIG. 1 is a cross section of a unit cell of a power semiconductor component in the form of a GTO thyristor cell according to the invention.

FIG. 1 illustrates a GTO thyristor having a ballast resistor according to the invention. Like the figures that follow, FIG. 1 represents the cross section of a unit cell of a power semiconductor component, in the following also briefly identified as component. The semiconductor body comprises adjacent to the anode A a p-emitter region 1 which is adjoined by a lightly doped n-base region 2, by a p-base region 3 which then follows and in which an n-emitter region 4 is embedded, thus forming a pnpn-thyristor structure. The n-emitter region 4 is preferably embodied strip-shaped in the direction that extends perpendicular to the drawing plane. A p-region 5 is embedded in the n-emitter region 4, which p-region is comprised of two highly-doped $p^+$-regions 5a disposed toward the edge, a centrally disposed highly doped $p^+$-region 5b and more lightly doped p-regions 5c disposed in-between. This lateral structure of region 5 can be formed of two lateral $p^+pp^+$-structures whose $p^+$-regions 5b disposed toward the inside coincide. On the surface, the central $p^+$-region 5b is in ohmic contact with the cathode metallization K of the component, also identified as cathode, which is not in contact with the n-emitter region (4). The lateral $p^+$-regions 5a are provided with a floating cathode contact K' which simultaneously forms the contact with the n-emitter region 4 coming to the surface next to the $p^+$-regions. Preferebly, the n-emitter region 4a under the floating contact K' is doped more highly than in the region 4b under the $p^+$-region 5b connected with the cathode so as to obtain a lower cathode resistance. As is customary in a GTO thyristor, the p-base 3 is provided with a gate contact G.

If a filament of high current density now starts to form at a certain point of the emitter strips, this is countered by the voltage drop $V_R$ in the region 5c which forms the ballast resistor because the on-state voltage in the thyristor structure (1, 2, 3, 4a) is reduced by this voltage. An important difference compared to the arrangements in the above-cited EP 0 433 825 A1 is that a floating cathode contact (K') is provided from which flows, on the one hand, an electron current into the n-emitter region 4a and, on the other, a hole current of identical size to the cathode K via the $p^+$-region 5b. This arrangement circumvents a parasitic thyristor and its drawbacks. A further important advantage is that the thyristor of the unit cells under the floating contact K' does not have a short circuit of the p-base with the n-emitter and, therefore, fully carries current over the whole width in the on-state.

Figure 2:
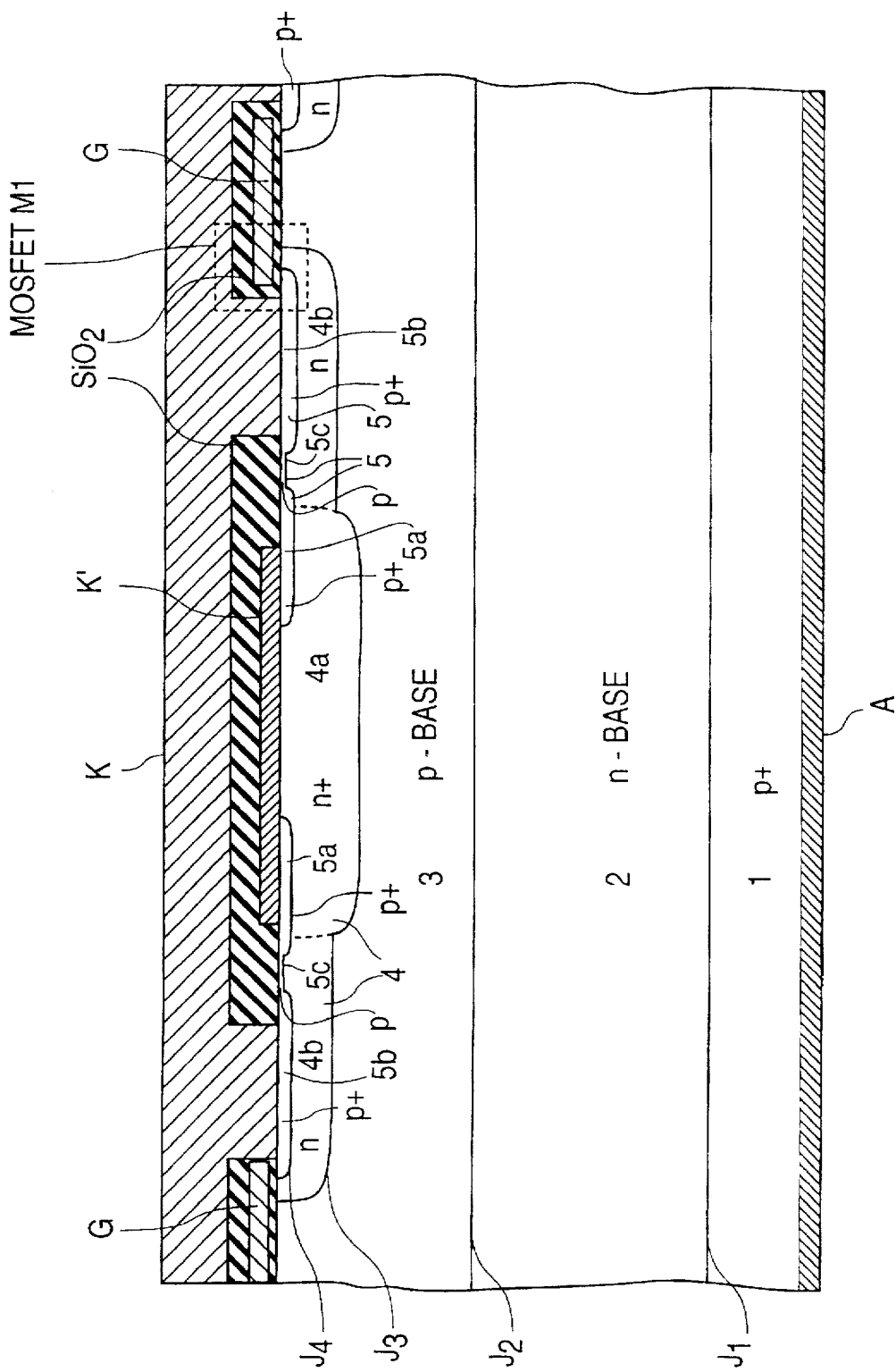
FIG. 2 is a unit cell of an MOS-controlled power semiconductor component according to the invention.

The invention can be used particularly advantageously to create an improved MOS-controlled thyristor. Such a component is illustrated in FIG. 2. As in FIG. 1, the semiconductor body comprises adjacent to the anode metal layer A, a p-emitter region 1 which is adjoined by a lightly doped n-base region 2, by a p-base region 3 which then follows and in which an n-emitter region 4 is embedded, thus forming a pnpn-thyristor structure. p-regions 5 are embedded in the lateral regions of the n-emitter region 4, which p-regions laterally have a $p^+pp^+$-structure and (in the direction perpendicularly to the drawing plane) extend parallel to the edge of the n-emitter region 4. Like the n-emitter region 4, they are preferably embodied to be strip-shaped in this direction. In this embodiment, the $p^+$-regions 5b provided with the cathode metallization are disposed on the outside, the $p^+$-regions 5a disposed toward the center have a floating contact K' which simultaneously forms an ohmic contact with the n-emitter region. The n-region between the outer $p^+$-regions 5b and the p-base 3 pulled to the surface is covered with an oxide on which a conductive gate material G is disposed which is preferably comprised of doped polysilicon. From the surface region of the p-base 3 as source region, the $p^+$-region 5b as the drain region and the surface region of the n-region 4b disposed in-between, a p-channel MOSFET (M1) of the depletion type is formed together with the insulated gate G.

If a potential is applied to the gate, which potential is negative compared to the n-region disposed underneath the gate and which is larger in absolute terms than the threshold voltage, a p-conductive inversion channel is formed at the surface of the n-region, which inversion channel connects the p-base with the cathode. With previous on-state operation, this initiates the turn-off process—as in the conventional MCT—since the hole current coming from the anode now largely flows off to the cathode without actuating the partial $n^+pn^-$-transistor of the thyristor structure formed of the regions 4, 3 and 2. Different than in the MCT, the n-emitter region 4 is at a higher potential than K because of the voltage drop $V_R$ in the resistive film 5c so that the p⁺n-junction between the regions 5b and 4 is polarized in the blocking direction. As the source voltage between the p-base region 3 acting as the source and the region 5b of the MOSFET M1 acting as the drain, it is not only the on-state voltage of the n⁺p-junction between the n-emitter region 4 and the p-base 3 that is available, as is the case in a conventional MCT, but a voltage which is increased by $V_R$. This accelerates the turn-off process and increases the current density that can be turned off. Here, it is advantageous to design the resistive film 5c such that the voltage drop $V_R$ in the resistive film is greater than the lateral voltage drop caused in the p-base 3 because of the hole current flowing to the p-channel of the MOSFET (M1). Then, a voltage that is larger than the pn-on-state voltage is always available as channel voltage so that the current that can be turned off is not limited by the lateral voltage drop in the control base.

The resistor of region 5c is approximately constant if the doping of this region 5c is sufficiently high. But if the integral doping of the p-region 5c is sufficiently light, the ohmic voltage drop along this region, which polarizes the pn-junction $J_4$ between the regions 5c and 4b in the blocking direction, results in a pinch-off of the neutral p-region 5c, which pinch-off increases in the direction toward cathode K. The resistance then rises along with the current which—as has been mentioned—is desired to amplify the effect. Then the p⁺pp⁺-structure cooperates with the n-emitter region 4b as a junction field effect transistor with 5a as the source region, 5b as the drain region and 4b as the gate region which is short-circuited with the source region.

Figure 3:
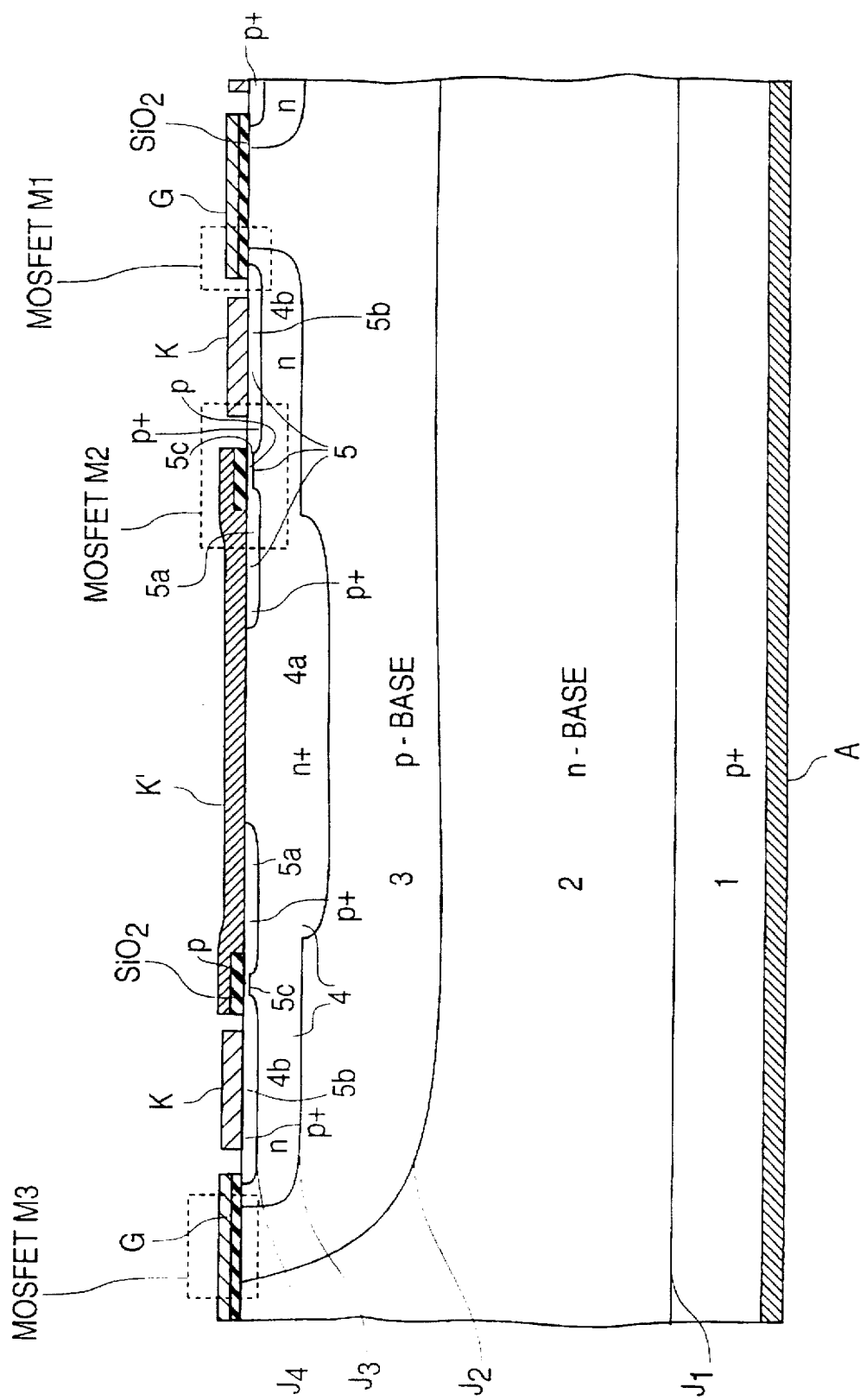
FIG. 3 is an embodiment of an MOS-controlled power semiconductor component wherein the ballast resistor is embodied as p-channel MOSFET of the depletion type according to the invention.

The non-linearity of the resistor already starts at lesser currents if the p-channel region 5c is provided with an insulated gate so that a p-channel MOSFET (M2) of the depletion type is created. The gate of this MOSFET is preferably short-circuited witch the floating cathode contact K' in that, for example, the gate is also covered by the floating metallization, as shown in FIG. 3. In contrast to FIG. 2, FIG. 3 shows a unit cell which cannot only be turned off but can also be turned on by the MOS gate. For this purpose, the pn-junction $J_2$ between the n-base 2 and the p-base 3 in the left portion of FIG. 3 is pulled to the surface, and the surface region of the p-base is covered by the gate. During this process, an internal n-channel MOSFET M3 is formed whose gate forms a uniform gate with the gate of the MOSFET M1 in this embodiment. If the gate is prepolarized positively with respect to the cathode, an n-channel forms on the surface of the p-base, whereby the thyristor structure is ignited. The ignition structure must not be present in all cells since the ignited state of the thyristor spreads to the neighboring cells by itself by way of lateral flows in the p-base and the n- base.

In the on-state operation, the current, which from the floating cathode K' enters the thyristor structure disposed underneath as electron current, flows off as hole current from K' to the outer cathode K through the internal p-channel MOSFET. Therefore, the current per edge length in the thyristor structure, i.e., parallel to the edge and perpendicular to the drawing plane, is at maximum identical to the saturation current of the two MOSFET's (M2) disposed in the n-emitter strips with clamped gate-source segment. Filaments with high current density are thus excluded. As can be seen, short-circuiting of the p-base with the cathode does not exist. The component is turned off by turning on the MOSFET M1 byway of a gate voltage which is negative with respect to the cathode K so that the p-base 3 is connected to the cathode K by way of a p-channel.

Figure 4:
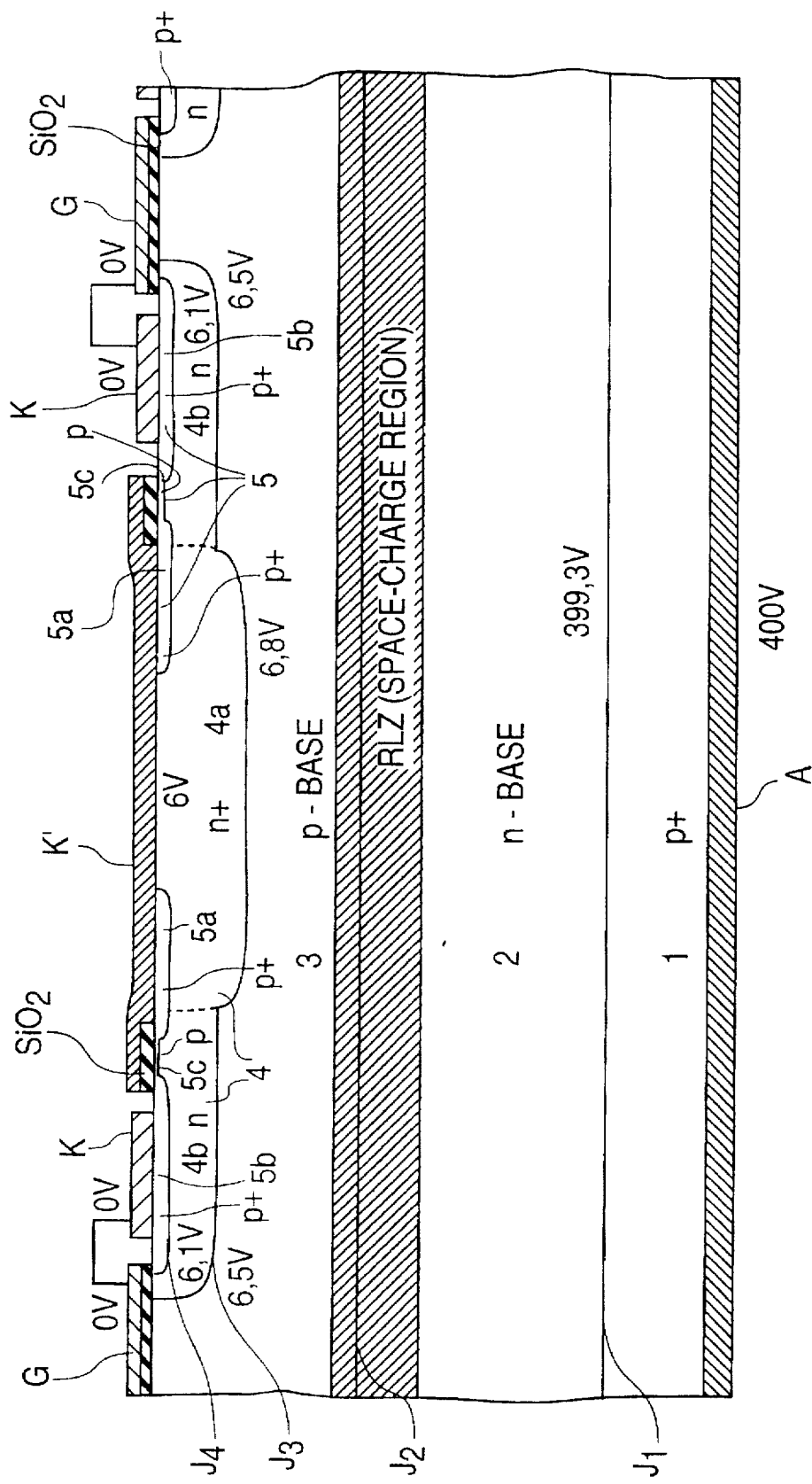
FIG. 4 is the potential distribution with overload on-state current in an MOS-controlled power semiconductor component.

FIG. 4 shows a component according to FIG. 3 having a unit cell without an ignition structure, with potential values drawn in for the case where the on-state current (e.g. as a result of a short circuit of the load) runs so high that the operating point runs on the characteristic of the internal MOSFET M2 into the region of the current saturation. As soon as the saturation current is reached, the partial pnp-transistor (1,2 3) of the thyristor structure (1, 2, 3, 4) is actuated merely by an almost constant electron current from the upper partial n⁺pn-transistor (4, 3, 2). The total current through the component can still rise by way of the rise of the hole current from the partial pnp-transistor, which is possible because the partial transistors increasingly leave the saturation and the current amplification factor $\alpha_{pnp}$ rises. In this process, a space-charge region can form around the pn-junction $J_2$ between p-base and n-base and build up a voltage there. If the MOS channel between p-base 3 and p⁺-region 5b is blocked, this usually results only in a hint of a current limitation since the increased hole current entering the p-base cannot flow off to the cathode and drives the pn-junction between the p⁺-region 5b and the n-region 4b into the avalanche breakdown by way of a small current increase in channel 5c. The electrons generated in this manner partially diffuse into the partial pnp-transistor (1, 2, 3) and allow the voltage that possibly already exists at the junction $J_2$ to collapse again.

In order to avoid this, the breakdown voltage of the internal MOSFET M2 is selected to be clearly larger than the threshold voltage of the external MOSFET M1 and the gate G during the on-state phase of the cathode potential. The potential values entered at different points of the structure in FIG. 4 relate to this case, which values are assumed for an excessively high on-state current which is not limited by the outer circuit. Related to the cathode with 0 V, in the assumed example the potential of the floating cathode K' and of the n-emitter region 4a amounts to 6 V caused by the voltage drop $V_R$ in the channel region 5c. In the lateral region 4b of the n-region 4, the potential is somewhat higher as a result of the electron current which is flowing to this region, for example, 6.1 V. Thus, the p⁺n-junction between the p⁺-region 5b and the n-emitter region 4b is polarized in the blocking direction with 6.1 V, while the breakdown voltage of this junction may amount to, for example, 12 V. If the threshold voltage to the inversion of the n-emitter region has a smaller value, e.g., 4 V, a p-channel forms at the surface of the n-emitter region 4b between the p-base and the p⁺-region 5b connected with the cathode because of the negative voltage of the gate vis-a-vis the semiconductor. This means that a bypass of the p-base to the cathode K is formed automatically. In a first approximation this occurs for the current wherein the voltage drop in region 5c exceeds the threshold voltage of the external MOSFET. The potential of the p-base 3 is higher than that of the n-region 4 because the pn-junction between these regions is polarized in the forward direction. In the center, the potential amounts to, e.g., 6.8 V, it is smaller in the proximity of the gate G, e.g., 6.5 V, as a result of the hole current flowing to the gate. This value is available as voltage at the p-channel which connects p-base 3 and p⁺-region 5b. A small increase of the electron current from the floating cathode K' thus results in a large increase of the hole current flowing off via this channel. Since during the almost constant actuation of the partial pnp-transistor (1, 2, 3) this implies a correspondingly large expansion of the space-charge region RLZ around the pn-junction $J_2$ and thus an increased voltage, a characteristic with a marked current saturation results. To turn off the current, the gate is then brought to a potential that is negative with respect to the cathode so that a p-channel exists even when the current is disappearing.

Figure 7:
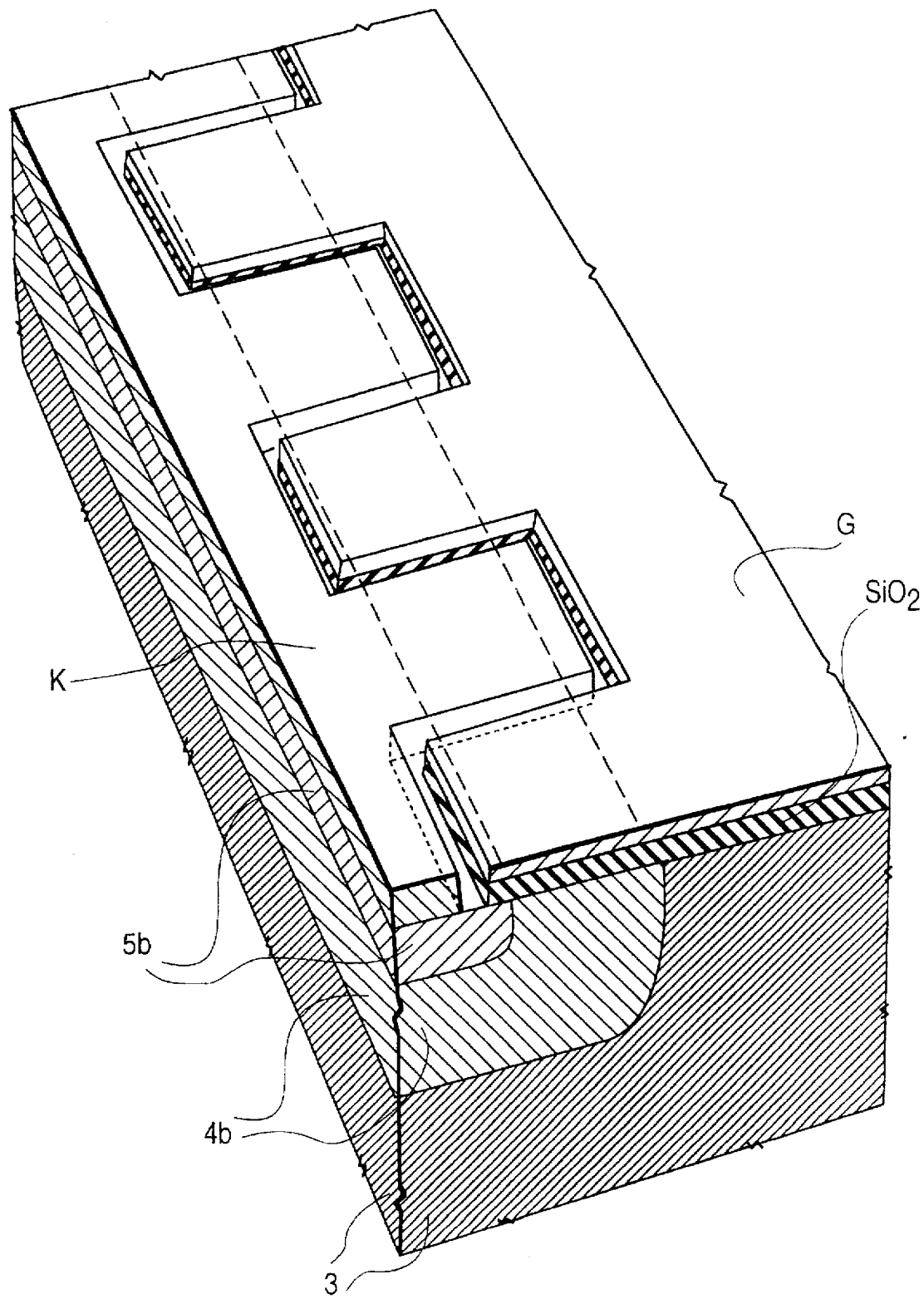
FIG. 7 is a perspective view of a specialized embodiment according to the invention.

Since the gate cathode circuit has a defined, control-related resistance and since the internal resistance of the polysilicon gate also does not disappear, an external interconnection of gate and cathode does not yet guarantee in every case that the gate stays fully on cathode potential when the current rises very rapidly. It may therefore be advantageous to take measures which support the effect of an external coupling of gate and cathode or which even result in a current-limiting characteristic already when the gate is open. Such an embodiment of the invention is one in which segments of the gate metallization are separated from the gate G in portions of the available gate edge length along the n-region 4b (perpendicularly to the drawing plane of FIG. 4, see FIG. 7) and are in direct contact with the cathode metallization. These regions which are clamped with the cathode and the gate regions disposed in-between must be distributed over the edge length as evenly as possible.

Figure 5:
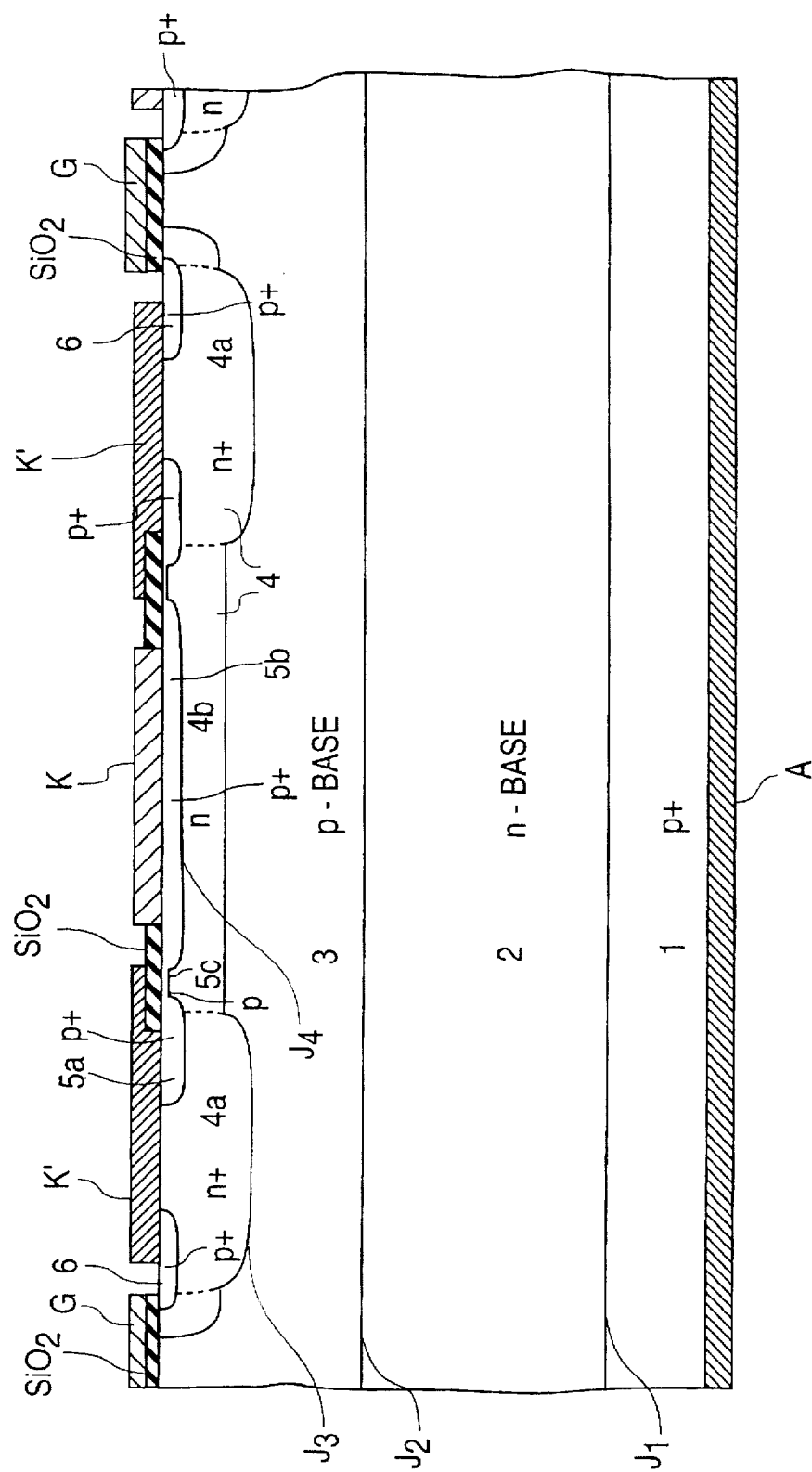
FIG. 5 shows an alternative embodiment to FIG. 3 of an MOS-controlled power semiconductor component according to the invention.

An embodiment of an MOS-controlled thyristor according to the invention representing an alternative to FIG. 4 is shown in FIG. 5. As in FIG. 1, there exist per n-emitter strip two pnpn-thyristor structures with floating cathode contacts K' which are arranged in the edge regions. The outer cathode K, however, comprises a metal strip which sits on a central $p^+$-region. With the semiconductor region disposed underneath, gate G and floating cathode K' form a structure which is identical to the conventional MCT, but with the difference that the contact K' is a floating cathode which is only connected with the outer cathode K via the lateral p-channel MOSFET M2. As in FIG. 3, the floating cathode simultaneously forms the gate of the internal MOSFET M2. In the on-state operation, the current, which from the floating cathode K' enters the thyristor structure disposed under the floating cathode as electron current, flows off as hole current through the lateral $p^+pp^+$-structure to the outer cathode K. In contrast to the embodiment according to FIG. 3, also the hole current flowing off through the external MOSFET M1 flows off during turn-off to the cathode K through the internal MOSFET M2. Thus, the MOSFET M2 always carries the total current.

Figure 6:
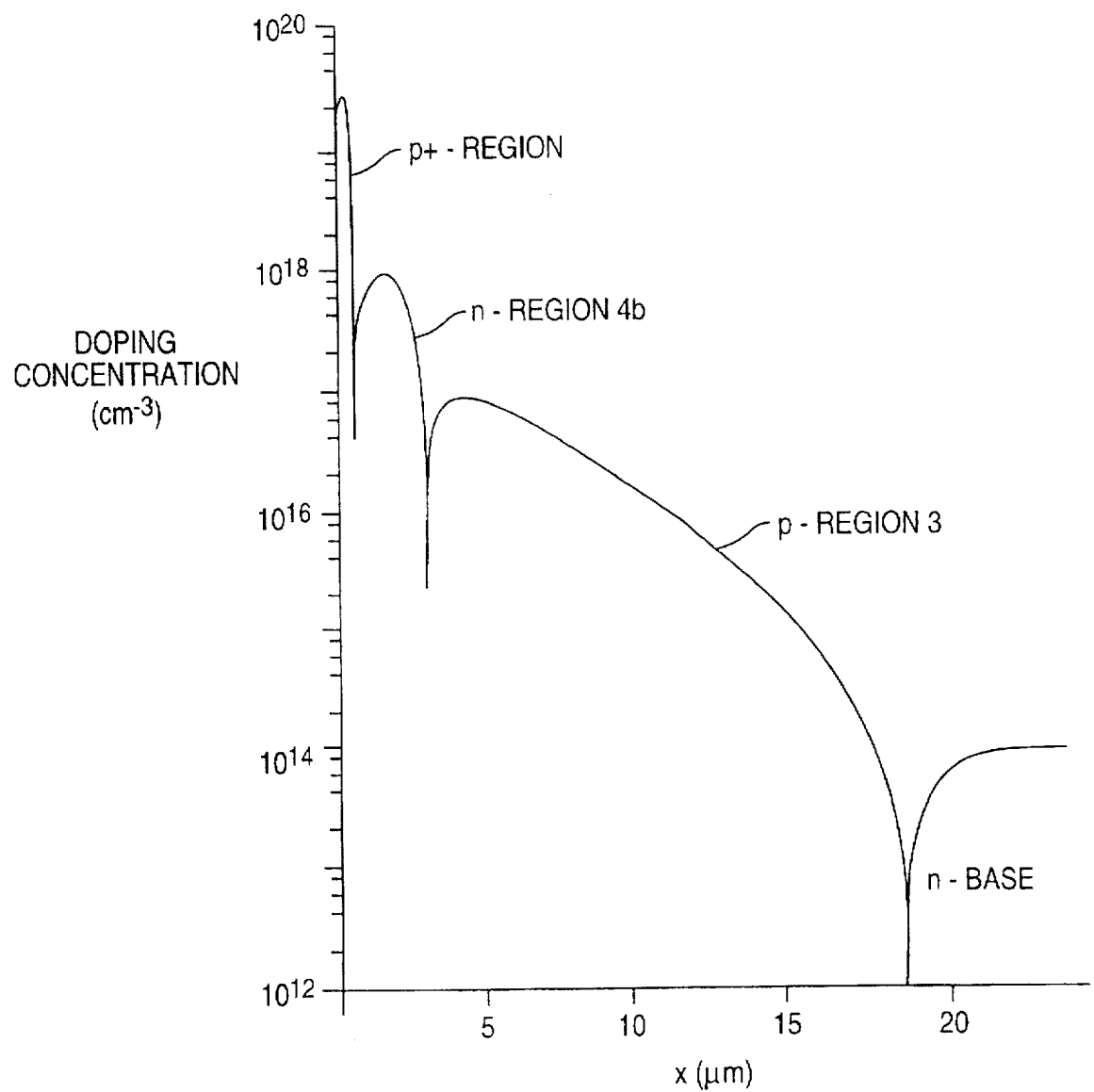
FIG. 6 illustrates a vertical doping profile of the $p^+np$-transistor structure under the cathode of the power semiconductor component illustrated in FIG. 2.

As has been mentioned, the breakdown voltage of the $p^+n$-junction J4 between the regions 4b, 5b, which voltage determines the breakthrough voltage of the MOSFET M2, must be larger than the threshold voltage of the MOSFET M1. The difference should be at least 2 V. But a larger difference is desirable, e.g., 10 V. For a threshold voltage of 3 V, the breakdown voltage then amounts to 13 V. This voltage can be reached by a doping of the region 4b which must not be too high and/or a doping gradient at the $p^+n$-junction $J_4$ which must not be too high. Even for a small threshold voltage, the doping concentration of region 4b must not be too large at the surface (e.g., $1*10^{17}/cm^3$). But, together with the p-base region 3 and the $p^+$-region 5b, the n-emitter region 4 should additionally meet the condition that the $pnp^+$-transistor structure (3, 4, 5b) with the cathode K as collector only has a low current amplification factor so that the hole current flowing off to the cathode through this parasitic thyristor is small. This hole current is ineffective for the actuation of the partial $n^+pn$-transistor (4a, 3, 2) of the thyristor structure. In order to meet the conditions, the integral doping of the n-region 4b is selected to preferably be in the range $5*10^{13}/cm^2$ to $5*10^{14}/cm^2$. Technically, a suitable doping profile may be realized in different ways. FIG. 6 illustrates a doping profile of the $pnp^+$-transistor (3, 4b, 5b) wherein the n-emitter region 4b was produced by way of ion implantation with an energy in the range of 1.5 MeV, while the p-region 3 and the $p^+$-region 5b were generated by diffusion. In this case, the breakdown voltage of the pn-junction $J_4$ amounts to approximately 13 V. The threshold voltage of the MOSFET M1 is approximately 3 V if the oxide thickness is 80 nm. The integral doping concentration of the n-emitter region 4b is $9*10^{13}/cm^2$.

We claim:

1. A power semiconductor component which can be turned off by gate control and whose semiconductor body has a plurality of unit cells arranged side by side which are comprised of a p-emitter region adjacent to an anode, an adjoining lightly doped n-base region, followed by a p-base region and an n-emitter region embedded therein and which unit cells form a thyristor structure; and wherein at least one p-region is embedded in the n-emitter region of the unit cells, with the p-region forming a ballast resistor and being provided with two ohmic contacts one of which forms an outer cathode metallization which has no contact with the n-emitter region, and the other of which is a floating cathode contact which simultaneously contacts the n-emitter region ohmically.

2. A power semiconductor component according to claim 1, wherein two p-regions are embedded in the n-emitter region.

3. A power semiconductor component according to claim 1, wherein the p-region embedded in the n-emitter region has a lateral $p^+pp^+$-structure such that it is more highly-doped under the two contacts than in an intermediate region which forms the ballast resistor.

4. A power semiconductor component according to claim 1, wherein between the p-base region and the p-region, embedded in the n-emitter region is an integrated p-channel MOSFET (M1) of the depletion type whose source region and drain region are respectively formed by these p-base and p-regions and with which the power semiconductor component can be turned off by generating a p-channel connecting the p-base region with the cathode metallization.

5. A power semiconductor component according to claim 3, wherein the lateral $p^+pp^+$-structure together with an insulated gate form an internal p-channel MOSFET (M2) of the depletion type whose gate is directly connected with the floating contact which acts as a source electrode.

6. A power semiconductor component according to claim 4, wherein a partial region of an edge portion, in the proximity of the cathode metallization, of the gate of the integrated p-channel MOSFET (M1) of the depletion type is separated from a remainder of the gate and is connected with the cathode metallization.

7. A power semiconductor component according to claim 5, wherein a breakdown voltage of the internal p-channel MOSFET (M2) of the depletion type exceeds a threshold voltage of the integrated p-channel MOSFET (M1) of the depletion type, which can be externally actuated, by at least 2 V.

8. A power semiconductor component according to claim 1, wherein the n-emitter region in a region under the floating cathode contact is more highly doped than in a remaining portion of the n-emitter region.

9. A power semiconductor component according to claim 8, wherein an integral doping concentration of the more lightly doped remaining portion of the n-emitter region is greater than $5*10^{13}/cm^2$ and smaller than $5*10^{14}/cm^2$.

10. A power semiconductor component according to claim 2, wherein the p-regions embedded in the n-emitter region each have a lateral $p^+pp^+$-structure such that they are more highly-doped under the two contacts than in intermediate regions which form the ballast resistor.

11. A power semiconductor component according to claim 3, wherein between the p-base region and the p-region, embedded in the n-emitter region is an integrated p-channel MOSFET (M1) of the depletion type whose source region and drain region are respectively formed by these p-base and p-regions, and with which the power semiconductor component can be turned off by generating a p-channel connecting the p-base region with the cathode metallization.

12. A power semiconductor component according to claim 11, wherein the lateral $p^+pp^+$-structure together with an insulated gate form an internal p-channel MOSFET (M2) of the depletion type whose gate is directly connected with the floating contact which acts as a source electrode.

13. A power semiconductor component according to claim 11, wherein a partial region of an edge portion, in the proximity of the cathode metallization, of the gate of the integrated p-channel MOSFET (M1) of the depletion type is separated from a remainder of the gate and is connected with the cathode metallization.

14. A power semiconductor component according to claim 12, wherein a breakdown voltage of the internal p-channel MOSFET (M2) of the depletion type exceeds a threshold voltage of the integrated p-channel MOSFET (M1) of the depletion type, which can be externally actuated, by at least 2 V.

15. A power semiconductor component according to claim 12, wherein the n-emitter region in a region under the floating cathode contact is more highly doped than in a remaining portion of the n-emitter region which determines the breakthrough voltages and threshold voltages of the MOSFETs (M1, M2).

16. A power semiconductor component according to claim 15, wherein an integral doping concentration of the more lightly doped remaining portion of the n-emitter region is greater than $5*10^{13}/cm^2$ and smaller than $5*10^{14}/cm^2$.

* * * * *